Figure 1:
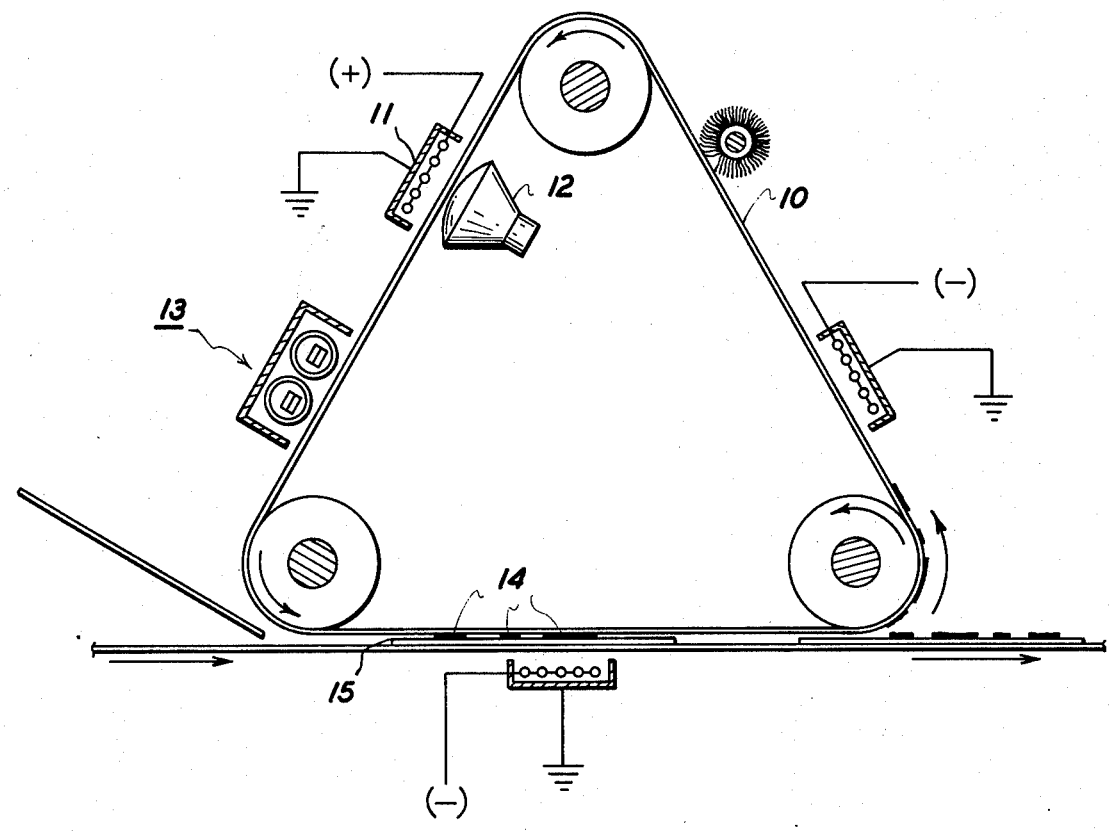
Figure 2:
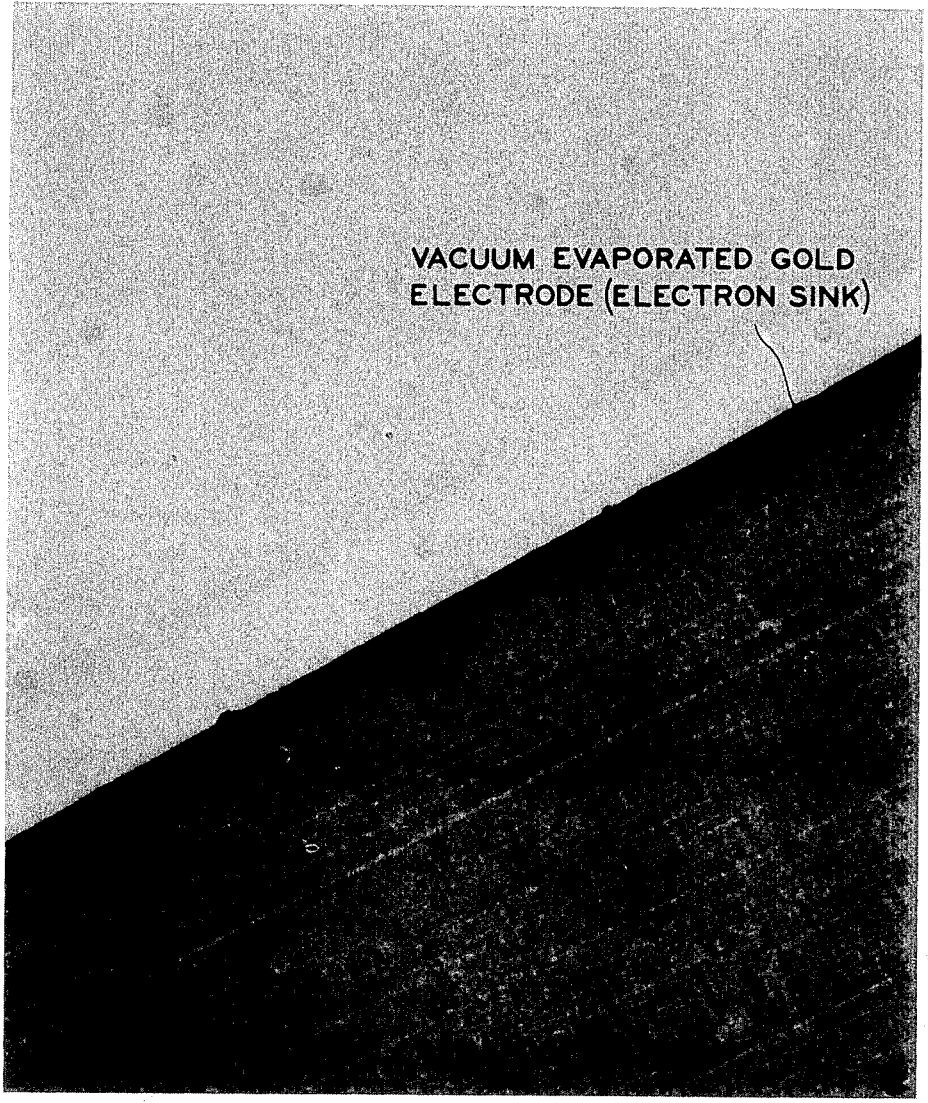
Figure 3:
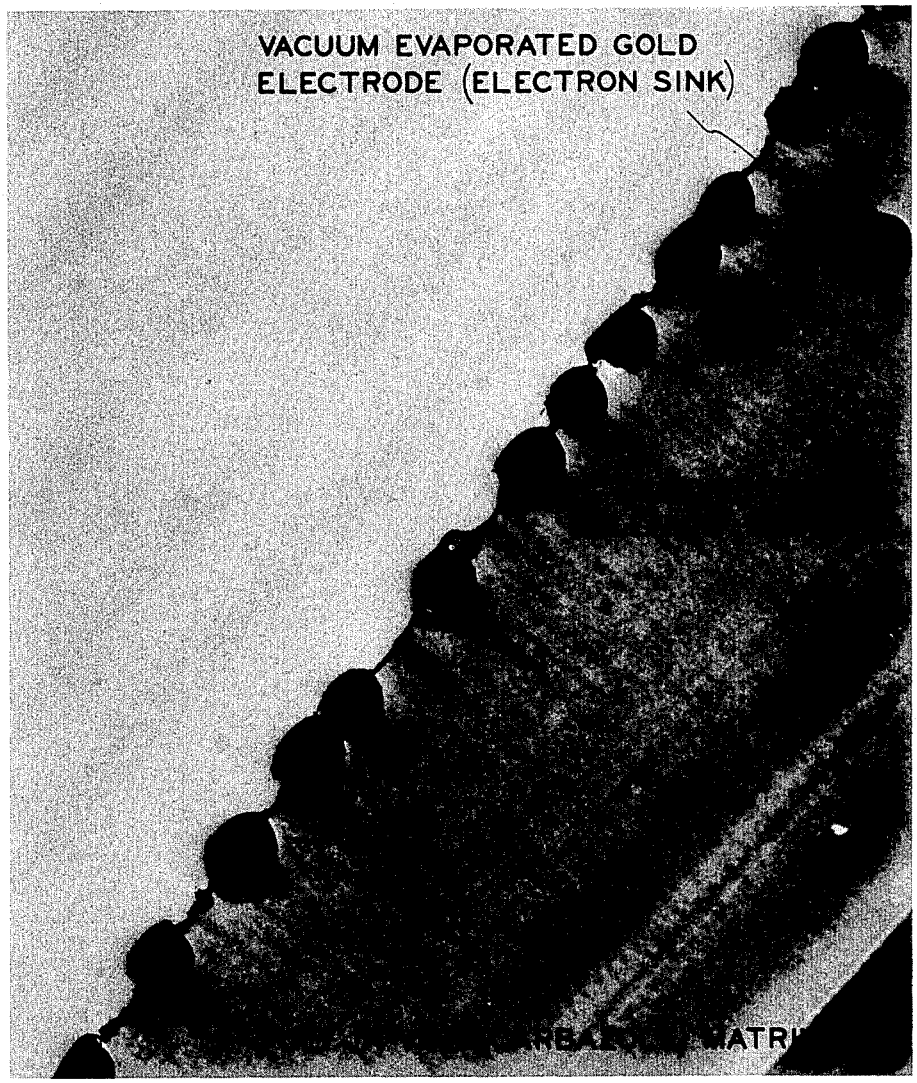
Figure 4:
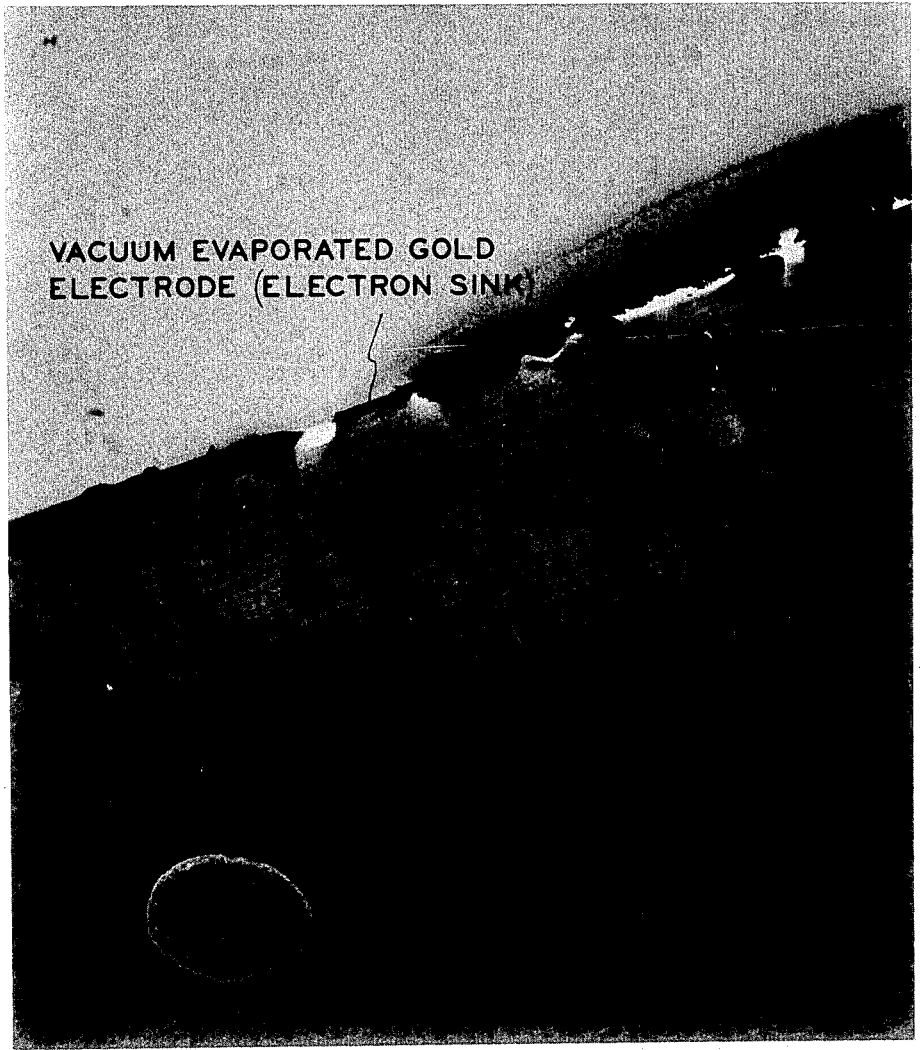

United States Patent [19]
Chu et al.

[11] 3,994,791
[45] Nov. 30, 1976

[54] PROCESS FOR PREPARATION OF SOLID PHASE DISPERSION OF PHOTOCONDUCTIVE MATERIALS

[75] Inventors: Joseph Y. C. Chu, Fairport; W. H. H. Gunther, Webster, both of N.Y.

[73] Assignee: Xerox Corporation, Stamford, Conn.

[22] Filed: Mar. 26, 1974

[21] Appl. No.: 454,896

[52] U.S. Cl. .................. 204/158 R; 204/158 HE; 96/1.5; 423/510; 252/62.3 S
[51] Int. Cl.² ................ B01J 1/10; G03G 5/04
[58] Field of Search ............. 204/158 R, 158 HE; 96/1.5, 115 R; 252/62.3 S; 260/607 R; 423/510

[56] References Cited
UNITED STATES PATENTS

| | | |
|---|---|---|
| 3,627,655 | 12/1971 | Perez-Albuerne ............ 204/158 R |
| 3,634,134 | 1/1972 | Trubisky et al. .................. 96/1.5 X |
| 3,758,301 | 9/1973 | Gunther ............................. 96/1.5 |
| 3,787,208 | 1/1974 | Jones ............................. 96/1.5 X |

FOREIGN PATENTS OR APPLICATIONS 2,233,868  2/1973  Germany

Primary Examiner—Howard S. Williams
Attorney, Agent, or Firm—James J. Ralabate; Michael H. Shanahan; John H. Faro

[57] ABSTRACT

Process for preparation of a solid phase dispersion of photoconductive materials in an insulating binder matrix from a film forming insulating polymeric resin and an organo-selenium compound capable of undergoing selective decomposition in response to an appropriate stimulus; whereby, elemental selenium is extruded from said organo-selenium compound and deposited in the binder matrix. Because this extrusion/deposition of elemental selenium can be performed selectively, it is possible to prepare binder films having photoconductive image patterns which are suitable for use in range extended and conventional xerography.

28 Claims, 4 Drawing Figures

2 IN. ≈ 1μ

MAGNIFICATION 50K

PROCESS FOR PREPARATION OF SOLID PHASE DISPERSION OF PHOTOCONDUCTIVE MATERIALS

BACKGROUND OF THE INVENTION

1. Field of the Invention

This invention relates to a process, an article prepared according to said process and a method employing said article. More specifically, this invention involves a process for preparation of a solid phase dispersion of photoconductive materials within an insulating binder matrix.

2. Description of the Prior Art

The formation and development of images on an imaging member of photoconductive materials by electrostatic means is well-known. The best known of the commercial processes, more commonly known as xerography, involves forming a latent electrostatic image on the imaging layer of an imaging member by first uniformly electrostatically charging the surface of the imaging layer in the dark and then exposing this electrostatically charged surface to a light and shadow image. The light struck areas of the imaging layer are thus rendered relatively conductive and the electrostatic charge selectively dissipated in these irradiated areas. After the photoconductor is exposed, the latent electrostatic image on this image bearing surface is rendered visible by development with a finely divided colored electroscopic powder material, known in the art as "toner." This toner will be principally attracted to those areas on the image bearing surface having a relative polarity opposite to the charge on the toner and thus form a visible powder image.

The developed image can then be read or permanently affixed to the photoconductor in the event that the imaging layer is not to be reused. This latter practice is usually followed with respect to the binder-type photoconductive films where the photoconductive insulating layer is also an integral part of the finished copy. U.S. Pat. Nos. 3,121,006; 3,121,007.

In so-called "plain paper" copying systems, the latent image can be developed on the imaging surface of a reusable photoconductor or transferred to another surface, such as a sheet of paper, and thereafter developed. When the latent image is developed on the imaging surface of a reusable photoconductor, the developed image is subsequently transferred to another substrate and then permanently affixed thereto. Any one of a variety of well-known techniques can be used to permanently affix the toner image to the transfer sheet, including overcoating with transparent films and solvent or thermal fusion of the toner particles to the supportive substrate.

In the most popular of the xerographic systems of the type referred to above, the imaging member comprises a photoconductive insulating layer of amorphous selenium on a suitable conductive substrate. Such photoconductive insulating layers are generally prepared by vacuum deposition of selenium under carefully controlled conditions. These vacuum deposition techniques do not readily lend themselves to the continuous manufacture of photoconductive imaging members. Even under carefully controlled conditions, vacuum deposition of photoconductive insulating layers of amorphous selenium is often beset with difficulties. For example, lack of uniformity in deposition can lead to so-called "pin holes" in the selenium layer. Spattering of molten selenium from the crucible in the deposition chamber has also been known to cause uneven deposition and blemishes in the surface of the imaging layer. Nor is it uncommon for the vacuum deposition chamber to be contaminated with dust particles which codeposit along with the selenium on the receptive substrate thus forming additional imperfections in the surface of imaging layer. In addition to the technique described above, a number of alternative procedures have been disclosed for preparation of selenium and selenium containing films. Representatives of such alternative procedures include the electrochemical deposition of selenium from a suitable electrolyte (U.S. Pat. Nos. 2,649,409 and 2,414,438) and the chemical deposition of a metal selenide film from a solution containing a metal salt, selenourea and other ingredients, Chem. Abstr. 79, 84806j (1973). Although such electrochemical and chemical deposition procedures can provide very precise control over both the rate and uniformity of deposition selenium and metal selenide films, neither system has received general commercial acceptance.

Recently, a number of alternative photoconductive insulating layers have been disclosed wherein a photoconductive pigment is (a) dispersed in a charge carrier transport matrix, (UK Patent 1,343,671, which in turn claims priority to U.S. application Ser. No. 371,646, filed June 20, 1973) or an electronically inert binder U.S. Pat. No. 3,787,208 or (b) sandwiched between a conductive substrate and a charge carrier transport layer, UK Patent 1,337,228 (which in turn claims priority to U.S. application Ser. No. 94,139, filed Dec. 1, 1970).

In the imaging members disclosed in previously referenced UK Patent 1,343,671, the carrier generation and transport functions are separated and, thus, it is possible to prepare photoconductive insulating layers having less than 10 parts by weight selenium in the imaging layer of the photoreceptor while retaining electrophotographic speed at least comparable to that of amorphous selenium alone. Since the photoactive material, (e.g. a selenium pigment), is dispersed in the insulating resin, the method for preparation of photoconductive insulating layers from such dispersions can follow generally accepted coating techniques applicable to such resinous materials. The simplicity of such procedures can be readily adapted to a continuous manufacturing process thereby increasing the efficiency of preparation of such photoconductors. In preparation of such binder layers, a photoactive pigment and an electronically active insulating binder resins are dispersed in an appropriate solvent and the resulting dispersion cast or coated on a conductive substrate to the desired film thickness. The resulting film contains a random distribution of photoactive particles throughout a charge transport matrix.

Carrier generation and transport functions can also be separated in non-binder photoreceptor systems (UK Patent 1,337,228) simply by overcoating a thin layer of amorphous selenium with an electronically active matrix, such as poly-(N-vinylcarbazole). In the dark, the overcoating is sufficiently insulating to support a sensitizing surface charge, (relieving the selenium layer from performing this function), and thus allowing the use of a selenium photogenerator layer of reduced thickness. The overcoating also helps to mask surface imperfections in the selenium layer.

Where it is possible to orient such photoconductive particles within a suitable binder (U.S. Pat. No.

3,787,208) the concentration of such photoconductive pigments can be further reduced without any compromise in the electrophotographic speed of the photoconductive insulating layer. The mechanism involved in the orientation of such photoconductive pigments in the above referenced application is analogous to the situation existing in preparation of ceramic materials from refractory mixtures having a predetermined particle size distribution. In such a system, the smaller particles are forced to occupy the spaces between the larger particles. Although this system provides a degree of control over the spatial distribution of photoconductive pigments within a binder layer, such control is a function of particle size distribution rather than an ordering of such materials in compliance with a predetermined arrangement or pattern.

The controlled distribution of chalcogenides within an amorphous glassy matrix has just recently been disclosed in German patent application OLS 2,233,868 (priority being claimed to U.S. patent application Ser. No. 163,891, filed July 19, 1971). This German application describes a series of systems wherein a precursor (an "organo-elemento" compound) is initially dispersed in the amorphous glassy matrix and chalcogenides selectively extruded therefrom in response to (a) exposure to imaging energy followed by exposure to development energy; (b) simultaneous exposure to both the imaging and the development energy; or (c) exposure to imaging energy. The glassy matrix within which such chalcogenide deposition takes place must be capable of trapping of the intermediate compounds, radicals and charge carriers generated during exposure to imaging energy in order to enable subsequent thermal development and/or enhancement of the desired chalcogenide deposit. Chalcogenide formation is manifest within the glassy matrix by the appearance therein of a permanent, dense and highly visible deposit.

Accordingly, it is the object of this invention to provide a process for preparation of a solid phase dispersion of selenium in an organic polymeric matrix.

More specifically, it is the object of this invention to provide a process for preparation of a photoconductive insulating layer comprising a solid phase dispersion having randomly dispersed selenium particles throughout an electrically inert polymer matrix.

Another object of this invention is to provide a process for preparation of a photoconductive insulating layer comprising a solid phase dispersion having randomly dispersed selenium particles throughout a polymer matrix which is capable of efficient transport of charge carriers of at least one polarity.

Yet another object of this invention is to provide a process for preparation of a photoconductive insulating layer having substantially two separate and highly localized phases, one phase comprising a photogenerator layer and a second phase comprising a charge carrier transport layer.

Still yet another object of this invention is to provide a series of articles prepared by the above processes.

Additional objects of this invention include the use of these articles in one or more imaging methods.

SUMMARY OF THE INVENTION

The above and related objects are achieved by providing a process for preparation of a solid phase dispersion comprising selenium particles in an insulating polymeric matrix. In this process, a selenium precursor can be initially combined with a film forming polymeric material in an appropriate solvent and the resulting dispersion or solid solution formed into a film either on or independent of a supportive substrate. The selenium precursor in such films is an organo-selenium compound which, upon exposure to electromagnetic radiation of the appropriate wavelength, is capable of undergoing substantial carbon-selenium bond scission whereupon elemental selenium is extruded from said compound and deposited within the polymer film in substantial conformity with the distribution of electromagnetic radiation throughout said film. In the preferred embodiments of the process of this invention, the solid phase dispersion can be substantially depleted of selenium particles by simply heating said dispersion to a given temperature for the required interval.

DESCRIPTION OF THE INVENTION INCLUDING PREFERRED EMBODIMENTS

The source of elemental selenium in the process of this invention (hereinbefore and hereinafter referred to as "selenium precursor" compounds) can be selected from a limited number of materials which are capable of undergoing a decomposition reaction in response to an appropriate stimulus (preferably ultraviolet light) and yielding, as one of the products of such decomposition, elemental selenium. The by-products of such decomposition reaction must also be compatible with both photogeneration and transport of charge carriers within the film and preferably assist in the photogeneration and/or transport of such charge carriers. Precursor compounds which have proven themselves highly useful in the process of this invention include organo-selenides of the formula

wherein $R$ and $R_1$ are independently selected from the group consisting of benzyl, alkyl substituted benzyl, alkoxy substituted benzyl, acyl substituted benzyl, amino substituted benzyl, amido substituted benzyl, arylalkyl substituted benzyl, aryl substituted benzyl, alkoxy alkyl substituted benzyl, aryloxy alkyl substituted benzyl, amino alkyl substituted benzyl, hydroxy alkyl substituted benzyl, alkyl amino substituted benzyl, aryl amino substituted benzyl, alkyl carbonyl substituted benzyl, alkyl thio substitued benzyl, alkyl seleno substituted benzyl, carboxamido substituted benzyl, halogen substituted benzyl, carboxyl substituted benzyl, cyano substituted benzyl, and nitro substituted benzyl; alkyl, alkoxy, amino substituted alkyl, amido substituted alkyl, aryl alkyl, alkoxy alkyl, aryloxy alkyl, hydroxy substituted alkyl, carbonyl substituted alkyl, thio substituted alkyl, seleno substituted alkyl, carboxamido substituted alkyl, halogen substituted alkyl, carboxy substituted alkyl, cyano substituted alkyl, and nitro substituted alkyl; cyclo alkyl and substituted cyclo alkyl; heterocyclic radicals; and acyl radicals; and $n$ is 1 to about 4.

Many of the compounds within the scope of the above formula are readily available from commercial sources and where not so available can be prepared by methods disclosed in the technical literature. For example, symmetrical dialkyl selenides can be prepared by the reaction of an alkyl halide with sodium selenide, M. L. Bird et al, J. Chem. Soc., 570 (1942); R. Paetzold et al, Z. Anorg, Allg. Chem., 360, 293 (1968). The most common method for preparation of unsymmetrical dialkyl selenides is a modified Williamson synthesis, H. Rheinboldt, "Houben — Weyl Methodender Organischen Chemie," Volume IX, E. Muller, Ed., Georg Thieme Verlag, Stuttgart, pp. 972, 1005, 1020, and 1030 (1955).

Diselenides within the scope of the above formula can be prepared by alkaline hydrolysis of organo selenocyanates (H. Bauer, Ber., 46, 92 (1913)) or selenosulfates (W. H. H. Gunther and M. N. Salzman, Ann. N. Y., Acad. Sci., 192, 25 (1972)). The preparation of unsymmetrical diselenides suitable for use as selenium precursor compounds are typically prepared by reaction of organic selenyl bromides with organic selenols, H. Rheinboldt and E. Giesbrecht, Chem. Ber. 85, 357 (1952). Heterocyclic selenium precursor compounds capable of undergoing substantial carbon-selenium bond scission upon irradiation with ultraviolet light can be prepared by reaction of organic bromides with organic selenates, L. Chierici et al, Ric. Sci., 25, 2316 (1955).

Polyselenides ($n$ equal to 3 or 4) can also be readily prepared by techniques disclosed in the literature For example, aromatic triselenides can be synthesized by reaction of aromatic selenenyl selenocyanates with thiols, H. Rheinboldt et al, Chem. Ber. 88, 1 (1955).

A second class of selenium precursor compounds which is suitable for use in the process of this invention can be represented by the following formula

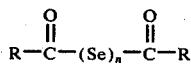

wherein
R and $R_1$ are the same as previously defined for compounds R — (Se)$_n$ — $R_1$ in addition to aryl and substituted aryl,
$n$ is 1 or 2.

Diacyl and diaroyl selenides within the scope of the above formula can be prepared by reaction of acyl chlorides with hydrogen selenides, K. A. Jensen et al, Acta. Chem. Sand., 26, 1465 (1972).

A third class of precursor compounds which can be used in the imaging process of this invention include the tetravalent selenium compounds represented by the formula:

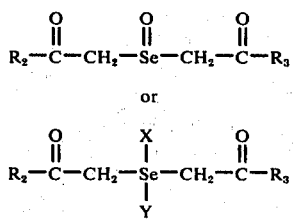

wherein
$R_2$ and $R_3$ are independently selected from the group consisting of aryl or substituted aryl radicals and
$x$ and $y$ are independently selected from the group consisting of halogen, hydroxyl, alkanoyloxy or aroyloxy.

Dichloroselenides of the above formula can be prepared either by reaction of methylaryl ketones with selenium tetrachloride or reaction of methylaryl ketone with selenium oxychloride; F. Kunckell et al, Justus Liebigs Ann. Chem. 314, 281 (1901); and R. E. Nelson et al, J. M. Chem. Soc. 52, 1588 (1930).

A fourth class of selenium precursor compounds which are suitable for use in the method of this invention include many of the selenium analogues of amides, biurets, carbazones, carbazides, esters, cyanoesters, selenoesters, semicarbazones, semicarbazides, ureas, substituted analogues thereof and heterocyclics containing these analogues as a component of the heterocyclic moiety. Compounds of the type described above can be readily prepared by methods reported in "Organic Selenium Compounds," Klayman and Gunther, Ed., Chapter VII pp. 273 – 303, John Wiley and Son (1973).

Selenoureas which are suitable for use in the process of this invention include compounds of the formulae

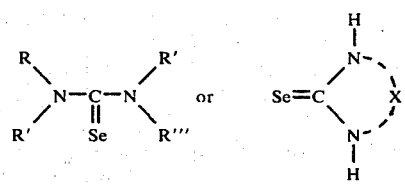

wherein
R, R', and R''' are independently selected from the group consisting of hydrogen, alkyl, substituted alkyl, aryl or substituted aryl; and
X is a divalent organic radical capable of making up the balance of the heterocyclic ring.

Selenobiurets which are suitable for use in the process of this invention include compounds of the formulae

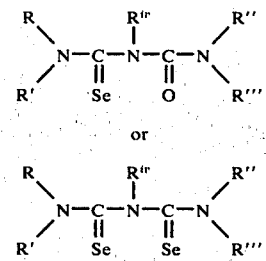

wherein
R, R', R'', R''' and $R^{iv}$ are independently selected from hydrogen, alkyl, substituted alkyl, aryl or substituted aryl.

Selenocarbazides and semicarbazides which are also capable of undergoing substantial selenium-carbon bond scission in response to an appropriate stimulus include compounds of the formulae

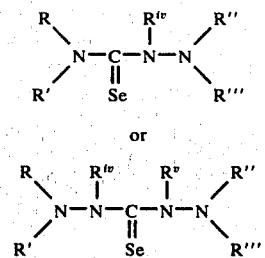

wherein $R, R', R'', R''', R^{iv}$ and $R^v$ are independently selected from hydrogen, alkyl, substituted alkyl, aryl or substituted aryl.

selenocarbazones and semicarbazones which also useful as selenium precursor compounds in the process of this invention include compounds of the formulae

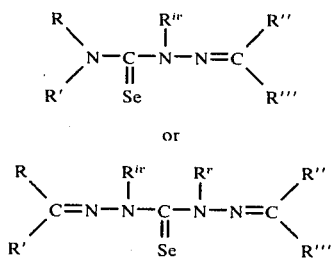

wherein $R, R', R'', R''', R^{iv}$ and $R^v$ are independently selected from hydrogen, alkyl, substituted alkyl, aryl or substituted aryl.

Additional selenium analogues of carbonyl compounds which are suitable as selenium precursors in the process of this invention include such heterocyclic compounds as the selenium analogues of uracil. Where a carbonyl compound has more than one carbonyl function, selenium replacement of the carbonyl oxygen atoms may occur at one or more such sites.

A fifth class of selenium precursor compound which is suitable for use in the process of this invention includes compounds of the formula

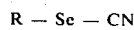

wherein $R$ is the same as previously defined for the compounds

Compounds of the above formula can be prepared by any one of a number of techniques disclosed in the literature. For example, such compounds can be prepared by the reaction of a cyanoselenyl radical with an alkyl or an arylalkyl halide; or by reaction of an aromatic diazonium salt with a seleno-cyanate ion; or the reaction of aromatic compounds bearing an activating substituent (such as an amino or hydroxyl group) with diselenodicyanide. These syntheses are more completely described in Chapter IV of the previously referenced text entitled "Organic Selenium Compounds."

The film forming insulating polymeric material used in combination with one or more of the above selenium precursor compounds in formation of the solid phase dispersions of this invention can be virtually any thermoplastic resin or elastomer which is both chemically compatible with one or more of the previously described organo selenium compounds and is capable of transmitting the energy necessary for initiating the desired decomposition reaction. Especially preferred polymeric materials which can be used in such solid phase dispersions include those polymers capable of transport of charge carriers generated by the elemental selenium and the other products of the decomposition reaction. Typical of such preferred materials are poly(N-vinylcarbazole), poly(vinylpyrene) and poly(N-ethyl-3-vinylcarbazole). Electronically inert polymers which are also suitable for use in such solid phase dispersion include polystyrene, poly(alkyl acrylates), poly(alkyl methacrylates), cyanoethyl starch, cyanoethyl cellulose, cellulose acetates, poly(vinylformal), poly(-vinylacetal), poly(vinylbuteryl), poly(butadiene), poly(dimethylsiloxane), poly(esters), their respective blends and copolymers.

In preparation of the solid phase dispersion of this invention, it is preferable to first dissolve the organo-selenium compounds and insulating polymeric resin in a common solvent. The resulting solution is then cast, sprayed, draw or dip coated on a supportive, preferably conductive, substrate. The relative weight ratio of organo-selenium compounds to polymeric materials in the coating solution can range from about 10.90 to about 90:10 and preferably from about 20:80 to about 30:70. The amount of solution transferred to the supportive substrate should be sufficient to form a coating having a dry film thickness in the range of from about 0.1 to about 100 microns. Any of the substrates traditionally used in combination with photoconductive insulating layers in electrophotographic imaging members can be coated with the above solution. Typical of such substrates include aluminum, chromium, nickel, metallized plastic films, metal coated plastic films, conductive cellulosic materials and metal oxide coated glass plates (e.g. NESA glass).

Alternatively, organo-selenium compounds may also be dispersed within a preformed, cross-linked film by swelling the latter in an appropriate solvent also containing one or more of the previously defined organo-selenium compounds. Upon evaporation of the solvent, the organo-selenium compounds remaining entrapped within the polymer matrix as a fine molecular dispersion. Such cross-linked polymer films have distinct and superior physical properties (e.g. abrasion resistance) when compared with films prepared from linear polymers. For example, highly cross-linked films are less soluble in many organic solvents, thus, permitting greater latitude in the casting or coating of additional layers thereon. Moreover, the more highly integrated network of such films precludes both moisture from penetrating into its bulk and the possible extraction of essential materials contained within these films, (as may occur during liquid development and/or subsequent cleaning of the surface of these films).

Once having formed a polymer/precursor compound coating on the supportive substrate in the manner described above, the coating is allowed to dry until substantially free of solvent residues used in its preparation. This coating containing the organo-selenium compound can then be subjected to a source of energy which is capable of effecting decomposition products its elemental selenium. The manner of transmission and type of energy employed to effect such decomposition reaction should not be sufficient to effect any substantial adverse alteration in the polymeric materials present in the coating. This coating containing the organo selenium compound can then be subjected to a source of energy which is capable of effecting decomposition of organo selenium compounds to elemental selenium. In a typical embodiment of this invention, a polymeric coating prepared as described above is irradiated with sufficient ultraviolet light to cause uniform extrusion of elemental selenium along the surface of the irradiated film. The distribution of selenium in this film can vary with the extent of distribution and depth of penetration of the extrusion energy into the film. For example, during uniform ultraviolet light illumination of a film containing a solid phase dispersion of organo-selenium compound, most of the incident radiation will be absorbed at or slightly below the surface of the film disposed proximate to the energy source. Upon absorption of this energy, selenium is extruded and deposited in substantial conformity with the distribution of this energy just below the surface of the film. As this deposition proceeds, the optical density of the film increases, thus, precluding penetration of extrusion energy into the more remote depths of the film. Where the film thickness is substantially in excess of the depth of penetration of substantial amounts of extrusion energy, the resulting member will not be suitable in conventional electrophotography due to inefficient photodischarge unless the polymeric matrix or some other material in the film provides the necessary carrier transport across that portion of the film which is substantially devoid of elemental selenium. The film thickness of such solid dispersions is, therefore, a function of the carrier transport efficiency of the insulating polymer matrix and the intended end use of the resulting article. Generally photoextruded selenium films, wherein the polymer matrix is electronically "inert," should have a thickness of about 2 microns, and preferably somewhat less, in order to be suitable for use in electrophotography. On the other hand, similarly photoextruded selenium films, wherein the polymer matrix has good carrier transport properties (electronically "active"), can exceed 100 microns in thickness without any adverse effect on their electrophotographic properties.

After having initially subjected the solid phase dispersion to activating electromagnetic radiation, it is possible to further alter the physical form and quantity of the deposited selenium within the polymer matrix merely by the application of heat at a predetermined temperature for an interval which is determined by the type and degree of alteration desired. For example, an essentially uniform layer of amorphous selenium located just below the surface of such a polymeric film can be caused to contract or agglomerate into small compact spherical amorphous particles; such contraction or agglomeration occuring at the site formerly occupied by the amorphous layer. Further heating to higher temperatures can cause the breakup of these particles into smaller particles and their wide spread dispersion throughout the polymeric film. Prolonged heating of this dispersion, as in the case where the organo-selenium compound is dibenzyl diselenide, can result in essentially a reversal of the decomposition reaction and, thus, a reduction in the concentration of elemental selenium within the polymeric matrix. Reversal of the decomposition reaction will in some instances result in reconstituting the selenium precursor compound. It is also possible, however, to erase the elemental selenium deposit without reversal of the decomposition reaction; that is without reconstituting the selenium precursor compound used in generation of the solid phase dispersion. In this latter instance, such erasure can result in the formation of another organoselenium compound. This new compound, in most instances, is capable of undergoing carbon-selenium bond scission in the same manner as the original precursor compound and thus the reusable nature of the dispersion is preserved even though the selenium precursor compound may now differ from the one initially incorporated into the insulating polymer matrix. Where such selenium is deposited along with or in the presence of other chalcogens (e.g. tellurium), the two elements may combine and thereby render subsequent erasure considerably more difficult or impossible.

Since the decomposition of the selenium precursor compound can be performed selectively in response to a localized stimulus, it is possible to prepare a photoconductive pattern of elemental selenium within a polymer matrix merely by projecting a pattern of extrusion energy onto a polymer film containing the precursor compounds. This photoconductive pattern can be in the form of spaced dots or have a screen type arrangement. Spaced dot photoconductors are suitable in preparation of half tone reproductions and screen type photoconductors are suitable for enhancing the solid density capability and extending the dynamic range of a photoconductive material, such as selenium. It is also possible to project an image pattern onto a polymer film containing these precursor compounds, and thus, produce a photoconductive image pattern within said film. This imaged film can be used as a xeroprinting master. In each of the systems described above, it is possible to subsequently "add on" additional information by merely projecting such additional information onto the previously exposed film.

The Examples which follow, further define, describe and illustrate the process of this invention. Apparatus and techniques used in this process and evaluation of the films prepared by this process are standard or as hereinbefore described. Parts and percentages appearing in such Examples are by weight unless otherwise indicated.

EXAMPLE I

Preparation of dibenzyl diselenide

A prerequisite to preparation of dibenzyl diselenide is the preparation of bis(methoxy magnesium)diselenide reagent. This material is prepared by placing about 3 grams (0.125 moles) magnesium turnings in a 1 liter round bottom flask together with a small crystal of iodine. This mixture is heated over a gas flame until the magnesium is "activated." About 200 milliliters dry methanol is then introduced into the flask, the flask fitted with a reflux condenser and a magnetic stirrer. The contents of the flask are heated to boiling under reflux conditions, and after the yellow iodine color has been discharged, about 7.9 grams (0.1 moles) dry selenium powder introduced into the mixture. The mixture is stirred until the initial vigorous reaction ceases and all solids have gone into solution.

About 12.6 grams (0.1 moles) benzylchloride is now added by dropwise addition over a period of 15 minutes to the magnesium diselenide reagent. In about 5 to 10 minutes after the mixture of these materials, the reddish brown color of the solution appears discharged. This solution is diluted further by the addition of 200 milliliters water and the addition of 10 milliliters concentrated hydrochloric acid. Upon cooling of this solution, the solids contained within the flask are collected by filtration and recrystallized from ethanol. Yield: 14 grams of yellow crystals (m.p. 94°C). Infrared spectral analysis of this material confirms that it is dibenzyl diselenide.

A chloroform solution containing about 0.5 parts by weight dibenzyl diselenide (DBDS) and 3 parts by weight poly(N-vinylcarbazole)—"Luvican," molecular weight 205,000, commercially available from BASF — is coated on a flexible ball grained aluminum plate using conventional draw bar coating techniques. The equipment used in this coating procedure is a Gardner mechanical drive film coating apparatus which is equipped with an application bar having a wet gap setting of 0.008 inches. The coated aluminum plate is placed in a hood for several hours and then transferred to a vacuum chamber where it remains overnight. Sufficient solution is transferred to the aluminum plate to provide a coating having a dry film thickness of approximately 10 microns. Upon substantially complete removal of residual chloroform from the coating, the coating is uniformly irradiated with ultraviolet light from a distance of 6 inches for a period of 10 minutes. The source of ultraviolet irradiation is a water-cooled 450 watt Hanovia medium pressure mercury arc lamp. The coating on the aluminum plate turns reddish orange indicating the presence of elemental selenium. The electrophotographic properties of the plate are now evaluated with a Xerox Model D processor. After charging this plate in the dark to a positive potential of about 600 volts, it is exposed to a light and shadow image by means of a Xerox No. 4 camera; exposure being for 12 seconds at $f$ 16. The latent image thus produced is rendered visible by cascade development with a composition comprising Xerox 2400 Toner and 250 $\mu$ steel MTP carrier. The toner image is transferred from the plate to a positively charged paper substrate and fused thereto. Toner residues remaining on the surface of the plate are removed by wiping its surface with a wad of synthetic cotton-like material. The plate is then reprocessed in the same manner described above. Copy quality remains substantially the same throughout.

EXAMPLES II – X

The procedures of Example I are repeated except for variation in the relative concentration of dibenzyl diselenide to poly(N-vinylcarbazole). The table which follows indicates the effect that such variation in concentration can have on xerographic print quality.

Example I. To this reagent is added about 10.1 grams (0.12 moles) butyrolactone, and the mixture heated to boiling under reflux conditions for 20 hours. At the end of this interval, the condenser is opened and the solvent within the flask allowed to evaporate. Water is now added to the residues remaining in the flask and the acidified solution extracted with ether. The yellow ether solution is reextracted with sodium hydroxide and 4,4'-diseleno dibutyric acid precipitated therefrom by the addition of hydrochloric acid. The precipitate is separated from the acidic medium and recrystallized from carbon tetrachloride. Yield: 11 grams of platelet like crystals, m.p. 88° C. Infrared spectral analysis of these crystals confirm them to be the desired product.

An electrophotographic imaging member is prepared in the manner described in Example I from 4,4'-diseleno butyric acid and poly(N-vinylcarbazole). The imaging member thus prepared is evaluated by standard electrophotographic techniques in the same manner described in Example I. Copy quality is satisfactory.

EXAMPLE XIII

Preparation of $\alpha,\alpha'$-diseleno-di-o-toluic acid

Bis(methoxy magnesium) diselenide reagent is prepared in the same manner described in Example I. About 13.4 grams (0.1 moles) phthalide is added to this reagent and the resulting mixture heated to boiling under reflux conditions with agitation for 20 hours. At the end of this period, the contents of the flask are allowed to cool, the clear supernatent liquid separated from the solid by decantation and discarded. About 300 milliliters water and 30 milliliters of 12 N hydrochloric acid are introduced into the flask containing these solids, the solids thoroughly dispersed within these liquids and thereafter separated therefrom by filtration. The solids are now dissolved in 2 N sodium hydroxide and the solution aerated until precipitation of selenium is complete. The selenium precipitate is removed by filtration and the clear orange filtrate acidified with hydrochloric acid. Upon acidification, a yellow precipitate forms which is dried over phosphorus pentoxide. The crude product is purified by initially

| Example | Composition of Coating Solution | | wt. % of DBDS in Photoreceptor | Xerographic Print |
|---|---|---|---|---|
| | DBDS wt. % | PVK wt. % | | |
| 2 | 1 | 4 | 20.0 | Good image, light background |
| 3 | 0.5 | 5 | 9.1 | Poor image |
| 4 | 1 | 5 | 16.7 | Fair to good image, light background |
| 5 | 2 | 5 | 28.6 | Good image, no background |
| 6 | 3 | 5 | 37.5 | Good image, moderate background |
| 7 | 4 | 5 | 44.4 | DBDS crystallized out |
| 8 | 1 | 10 | 9.1 | No image |
| 9 | 2 | 10 | 16.7 | Good image, no background |
| 10 | 3 | 10 | 23.1 | Good image, light background |
| 11 | 1 | 3 | 25.0 | Good image, no background |

EXAMPLE XII

Preparation of 4,4'-diseleno-dibutyric acid

Bis(methoxy magnesium) diselenide reagent is prepared in substantially the same manner as described in dissolving it in boiling methanol and thereafter allowing the resulting solution to stand at room temperature for several days; whereupon the purified product gradually crystallizes from solution. Yield: Yellow crystals, (m.p.

215°–218° C). Elemental analysis confirms that the crystals are the desired product.

An electrophotographic imaging member is prepared in the manner described in Example I from α,α'-diseleno-di-o-toluic acid and poly(N-vinylcarbazole). The imaging member thus prepared is evaluated by standard electrophotographic techniques in the same manner described in Example I. Copy quality is satisfactory.

EXAMPLE XIV

Preparation of dibenzyl selenide

Into a 250 milliliter 3 necked round bottom flask equipped with an addition funnel and a magnetic stirring bar is placed 4.6 grams (0.058 moles) of selenium powder and 50 milliliters of deoxygenated distilled water. The flask is purged of air with nitrogen and a solution comprising 4.6 grams (0.122 moles) sodium borohydride in 50 milliliters of deoxygenated distilled water slowly added to the solution in the flask from the addition funnel. Upon contacting of these two solutions, vigorous hydrogen evolution occurs and the selenium powder is consumed thereby yielding a solution containing sodium hydrogen selenide. About 14.6 grams (0.166 moles) benzylchloride is now introduced into the flask and the resulting mixture stirred at room temperature for 18 hours. The solid product thus produced is collected by filtration washed with water and recrystallized twice from pentane. Yield 11.81 grams of rod like crystals, (m.p. 45° to 46° C).

An imaging member is now prepared from dibenzyl selenide and poly(N-vinylcarbazole) in the manner described in Example I. This imaging member is evaluated in the same manner described in Example I. Copy quality is satisfactory.

EXAMPLE XV

Preparation of 2,2'-dipyridyl diselenide

This compound is prepared according to the procedure described by H. G. Mautner, et al, J. Org. Chem. 27, 3671 (1962). The product of this synthesis is crystallized from petroleum ether, (m.p. 47°–48° C).

An imaging member is now prepared from 2,2'-dipyridyl diselenide and poly(N-vinylcarbazole) in the manner described in Example I. This imaging member is evaluated in the same manner described in Example I. Copy quality is satisfactory.

EXAMPLE XVI

Preparation of 3,3'-di(2-methyl indolyl) diselenide

This compound is prepared in the manner described by L. B. Agenas in Ark. Kemi. 23, 157 (1964). Compounds prepared according to this method have a melting point of 183°–184° C.

An imaging member is now prepared from 3,3'-di-(2-methyl indolyl) diselenide and poly(N-vinylcarbazole) in the manner described in Example I. This imaging member is evaluated in the same manner described in Example I. Copy quality is satisfactory.

EXAMPLE XVII

Preparation of 3,3'-di(2-methyl indolyl) triselenide

This compound is prepared according to the method described by J. Wilshire, Australian J. Chem. 20, 359 (1967). The product of this synthesis is recrystallized from hexane/methylene chloride. m.p. 194°–197° C.

An imaging member is now prepared from 3,3'-di(2-methyl indolyl) triselenide and poly(n-vinylcarbazole) in the manner described in Example I. This imaging member is evaluated in the same manner described in Example I. Copy quality is satisfactory.

EXAMPLE XVIII

Preparation of bis(4-methyl-2-nitro-phenyl) triselenide

This compound is prepared according to the procedure described by H. Rheinboldt et al, Chem. Ber. 88, 1 (1955). The product of this synthesis is recrystallized from benzene. m.p. 151°–152° C.

An imaging member is now prepared from bis(4-methyl-2-nitro-phenyl) triselenide and poly(N-vinylcarbazole) in the manner described in Example I. This imaging member is evaluated in the same manner described in Example I. Copy quality is satisfactory.

EXAMPLE XIX

Preparation of benzyl seleno benzoate

A solution comprising 3.1 grams of dibenzyl diselenide in 200 milliliters of a solution of water/tetrahydrofuran (1:1) is reacted with about 0.5 grams sodium borohydride under a nitrogen blanket until the yellow color of the diselenide appears to be completely discharged. About 5 grams sodium bicarbonate and about 3 grams benzoyl chloride are now added to the reaction mixture with agitation. Stirring of the mixture continues until the characteristic odor benzoyl chloride is dissipated. The reaction mixture is then extracted with ether and water, the ether solution washed with saturated sodium sulfate, dried over anhydrous sodium sulfate and evaporated to an oily residue. The oily residue is crystallized with light petroleum (40°–60° C) to give colorless needles, (m.p. 29°–32° C).

An imaging member is now prepared from benzyl seleno benzoate and poly(N-vinylcarbazole) in the manner described in Example I. This imaging member is evaluated in the same manner described in Example I. Copy quality is satisfactory.

EXAMPLE XX

Preparation of dibenzoyl selenide

A sodium selenide solution is initially prepared by the reaction of about 3.2 grams (0.04 moles) of selenium powder with about 3 grams (0.08 moles) sodium borohydride in water according to the method described by D. L. Klayman et al, J. Am. Chem. Soc. 95, 197 (1973). The flask containing the sodium hydrogen selenide solution is purged of air with nitrogen and about 11.2 grams (0.08 moles) benzoyl chloride and about 10 grams sodium bicarbonate added to the reaction mixture with mild agitation. The ingredients within the flask are allowed to react at room temperature under nitrogen for 14 hours. The solid products are separated from the reaction medium by filtration, washed with water and recrystallized from a benzene/hexane solution to yield colorless needle like crystals, (m.p. 60°–61° C).

An imaging member is now prepared from dibenzoyl selenide and poly(N-vinylcarbazole) in the manner described in Example I. This imaging member is evaluated in the same manner described in Example I. Copy quality is satisfactory.

EXAMPLE XXI

Preparation of dibenzoyl diselenide

Preliminary to the synthesis of the above material, an aqueous sodium diselenide solution is prepared according to the procedures described by D. L. Klayman et al in J. Am. Chem. Soc. 95, 197 (1973). To this solution is been added about 28.1 grams (0.2 moles) benzoyl chloride and about 16 grams sodium bicarbonate. The reaction mixture is stirred for 16 hours at room temperature, the yellow solids collected, washed with water and recrystallized from benzene/hexane to yield a yellow crystalline material, (m.p. 130°–132° C).

An imaging member is now prepared from dibenzoyl diselenide and poly(N-vinylcarbazole) in the manner described in Example I. This imaging member is evaluated in the same manner described in Example I. Copy quality is satisfactory.

EXAMPLE XXII

Preparation of $\alpha,\alpha'$-dibenzoylseleno toluene

This material is prepared according to the procedures described by Szperl et al, Roczniki Chem. 12, 71 – 77 (1973). The product thus obtained, which is crystallized from carbon tetrachloride, has a melting point of 149°–150° C.

An imaging member is now prepared from $\alpha,\alpha'$-dibenzoyl seleno toluene and the poly(N-vinylcarbazole) in the manner described in Example I. This imaging member is evaluated in the same manner described in Example I. Copy quality is satisfactory.

EXAMPLE XXIII

Preparation of bis(benzoylseleno) methylene

About 17.1 grams poly(methylene oligo selenide) is suspended in 100 milliliters 1 N aqueous sodium hydroxide, the vessel containing the suspension purged of air with nitrogen and about 3.7 grams (0.1 moles) sodium borohydride added to this suspension. Upon the admixture of these two materials, the contents of the flask turns a deep brown however, after reaction at room temperature for about 1 hour the color of the reaction mass progressively lightens. About 75 minutes after the initial admixture of the two materials in the flask, a total of about 31 grams (0.22 moles) benzoyl chloride is introduced into the reaction vessel (in 5 equal portions), the contents of the flask rapidly stirred until the characteristic odor of benzoyl chloride has been dissipated and an oily solid covers the stirrer and walls of the reaction vessel. The contents of the flask are extracted with two 250 milliliter portions of ether, the ether solution washed with water, and saturated aqueous sodium sulfate. After drying over anhydrous sodium sulfate the solution is evaporated in a vacuum, leaving an oily partially crystallized residue. This residue is taken up in warm ligroin (b.p. 60°–100° C) and the resulting solution chilled to yield colorless needle like crystals, (m.p. 108° C). Elemental analysis of these crystals confirms the product to be bis(benzoylseleno) methylene.

An imaging member is now prepared from bis(benzoyl seleno) methylene and poly(N-vinylcarbazole) in the manner described in Example I. This imaging member is evaluated in the same manner described in Example I. Copy quality is satisfactory.

EXAMPLE XXIV

Preparation of selenium bis(acetophenone) dichloride

Into a 250 milliliter round bottom flask equipped with an addition funnel are placed 90 milliliters of anhydrous ether and 14.49 grams (0.12 moles) of acetophenone. The flask is cooled in an ice-methanol bath, and about 10 grams (0.06 moles) selenium oxychloride in 30 milliliters of anhydrous ether introduced into the flask by dropwise addition through the addition funnel. The mixture is stirred during such addition. Upon completion of the introduction of the contents of the addition funnel into the flask, the flask is removed from the ice bath and the contents stirred at room temperature for an additional 1 hour. At the end of this interval, a white solid precipitate is separated from the contents of the flask by filtration, washed with benzene and ether and rapidly recrystallized from chloroform to yield colorless needle like crystals, (m.p. 117°–118° C). Elemental analysis of the precipitate confirms the product to be selenium bis(acetophenone) dichloride.

An imaging member is now prepared from selenium bis(acetophenone) dichloride and poly(N-vinylcarbazole) in the manner described in Example I. This imaging member is evaluated in the same manner described in Example I. Copy quality is satisfactory.

EXAMPLE XXV

Preparation of selenobenzamide

A sodium selenide solution is initially prepared by the process described by Klayman et al (J. Am. Chem. Soc. 95, 197 (1973)), wherein about 7.8 grams (0.1 moles) selenium is reduced in aqeuous suspension with about 7.4 grams (0.2 moles) sodium borohydride). After the solution becomes colorless, its volume is increased 3 fold by dilution with ethyl alcohol (95 percent) and 10.3 grams (0.1 moles) benzonitrile added thereto. The vessel containing this solution is then sealed, and allowed to stand overnight (approximately 16 hours) at room temperature. The solution within the vessel (which subsequently turned orange in color) is diluted with equal parts water and ether, the ether phase collected, the aqueous phase extracted with additional ether, and both ether phases combined in a single vessel. The ether phase is thereafter dried over anhydrous sodium sulfate, the drying agent removed by filtration and the ether phase evaporated thereby yielding an oily crystalline residue. This residue is recrystallized from benzene/hexane (60:40) to yield an orange needle like product (m.p. 126°–127° C); which is subsequently confirmed by elemental analysis to be the desired product.

An imaging member is now prepared from selenobenzamide and poly(N-vinylcarbazole) in the manner described in Example I. This imaging member is evaluated in the same manner described in Example I. Copy quality is satisfactory.

EXAMPLE XXVI

Preparation of 2-selenopyridine

This compound is prepared according to the procedure described by H. G. Mautner et al J. Org. Chem. 27, 3671 (1962). The product obtained by the above method is recrystallized from benzene, (m.p. 132°–136° C).

An imaging member is now prepared from 2-selenopyridine and poly(N-vinylcarbazole) in the manner described in Example I. This imaging member is evaluated in the same manner described in Example I. Copy quality is satisfactory.

EXAMPLE XXVII

Preparation of 2,5-dimethyl-3-selenocyanatopyrrole

This compound is prepared according to the procedures described by L. B. Agënas, Ark. Chemi. 28, 145 (1967). The product thus obtained is crystallized from carbon tetrachloride, (m.p. 104°–107° C).

An imaging member is now prepared from 2,5-dimethyl-3-selenocyanatopyrrole and poly(N-vinylcarbazole) in the manner described in Example I. This imaging member is evaluated in the same manner described in Example I. Copy quality is satisfactory.

EXAMPLE XXVIII

Preparation of p-nitrophenyl seleno cyanate

This compound is prepared according to the method described by H. Bauer, Ber. 46, 92 (1913). The product obtained by this method is recrystallized from methanol (m.p. 135° C).

An imaging member is now prepared from p-nitrophenyl seleno cyanate and poly(N-vinylcarbazole) in the manner described in Example I. This imaging member is evaluated in the same manner described in Example I. Copy quality is satisfactory.

EXAMPLE XXIX

The procedures of Example I are repeated except that a sheet of NESA glass (tin oxide coated glass plates available from PPG Industries, Inc.) is substituted for the ball grained aluminum substrate. After the polymeric coating on the NESA plate is substantially free of residual solvents, it is subjected to blanket UV illumination through the NESA plate. As a result of this exposure, a substantially uniform layer of selenium is extruded and deposited proximate to the interface of the polymer coating and the NESA plate. The plate is then evaluated by standard xerographic techniques as follows: the surface of the polymeric coating is initially sensitized by corona charging to a negative potential of approximately 600 volts. The sensitized surface of this imaging member is thereafter exposed to image information. The source of illumination of the image information is white light. The latent electrostatic image thus produced is developed and transferred by conventional means, toner residues removed from the surface of the polymeric coating and the copying sequence repeated. Copy quality is satisfactory.

EXAMPLE XXX

The procedures of Example XXIX are repeated except that instead of blanket UV exposure of the polymeric coating, a discrete dot image pattern is projected through the NESA substrate onto the polymeric coating. As a result of such exposure, selenium is extruded and deposited, in substantial conformity with this discrete image pattern, proximate to the interface of the polymer coating and the NESA plate. The imaging member thus produced is sensitized, imaged and developed in the same manner described in the foregoing Example. Solid density development is improved over Example XXIX and the reproduction has improved continuous tonal qualities.

EXAMPLE XXXI

The procedures of Example XXX are repeated except that an optical screen pattern is substituted for the dot pattern. In the projection of this optical screen pattern with UV light through the NESA plate, the pattern is deliberately thrown slightly out of focus. As a result of such exposure, selenium is extruded and deposited, in substantial conformity to this screen pattern, proximate to the interface of the polymer coating and the NESA plate. The resulting imaging member is sensitized, imaged and developed in the same manner described in the foregoing Example. Solid density development has improved over that of Example XXIX and the dynamic range of this member has been extended beyond that of the members of Example XXIX and XXX.

EXAMPLE XXXII

The procedures of Example I are repeated except that a scroll of aluminized Mylar (polyethylene terephthalate, available from E. I. du Pont de Nemour Inc.) is substituted for the ball grained aluminum substrate. The aluminized surface of this substrate is coated with a polymeric coating of the type described in Example I. Subsequent to curing of this coating, the scroll is arbitrarily divided into a series of separate sections and each section exposed to one of a series of image patterns. The source of illumination of these image patterns is a medium pressure UV lamp of the type used in Example I. The imaged scroll is inserted in a device of the type shown in FIG. I. As the scroll 10 advances in the direction indicated by the arrow, it is subjected to simultaneous charging 11 and exposure 12 to white light. The latent image thus produced is rendered visible by reverse development at station 13 and the toner image 14 transferred to a receiving sheet 15. This process is repeated in sequence for each section of the scroll. Since the copies are prepared in sequence, no sorting or collating of the reproductions is required.

EXAMPLE XXXIII

About 3 grams dibenzyl diselenide (prepared in the manner described in Example I) and about 10 grams of a styrene/hexyl methacrylate copolymer (80/20) are dissolved in 25 milliliters tetrahydrofuran, and the resulting solution coated on a series of brushed aluminum plates using a Gardner mechanical drive film coating apparatus having a wet gap setting of 0.001, 0.002, 0.004 and 0.008 inch. Each of the four plates are allowed to dry overnight at room temperature, exposed to blanket UV illumination with a 450 Watt Hannovia medium pressure mercury lamp from a distance of 10 centimeters for periods ranging in time from 1 to 20 minutes, (the more extensive time intervals being required for the thicker coatings). As a result of said exposure, elemental selenium is apparently deposited uniformly throughout the coatings thus coloring these coatings from a pale yellow orange to deep brown. Plates thus prepared are thereafter sensitized by charging with a corona electrode to a positive potential of 700 volts. The sensitized plates are exposed to imagewise illumination using a Xerox No. 4 Camera for 10 to 30 seconds at $f$ 10. The latent image thus produced is rendered visible by cascade development utilizing Xerox 2400 Toner. Image resolution and contrast are satisfactory.

EXAMPLE XXXIV

About 2 grams dibenzyl diselenide (prepared as described in Example I) and about 10 grams of a copolymer of styrene/n-butylmethacrylate (70/30) are dissolved in 120 milliliters benzene. The resulting solution is draw-bar coated on a ball grained aluminum plate in the same manner described in the preceeding Example. Sufficient solution is transferred to the plate to produce a coating having a dry film thickness in the range of 8 to 10 microns.

The above plate is placed in the target area of an electron irradiation unit capable of generating a 30 kilo volt electron beem. The apparatus is thereafter sealed, the target area cooled to liquid nitrogen temperature and the atmosphere within the apparatus exhausted to a pressure of about $10^{-6}$ Torr. The film is allowed to warm to about 20° C and irradiated until the coating acquires a light orange color. Irradiation is thereafter discontinued, the vacuum seal broken and the film target removed from the apparatus. The electrophotographic properties of this film are now evaluated by charging the surface with a corona electrode to a positive potential of 700 volts followed by blanket illumination through an appropriate band pass filter at 400 nm. Continuous monitoring of the surface potential of the film with an electrometer reveals rapid and essentially complete discharge of the applied surface voltage occurs, indicating the existence of photoconductive pathways of selenium from the surface of the film to the conductive aluminum substrate.

The film is then reevaluated in the more conventional manner using standard Xerox Model D equipment as described in the previous Example. The film prepared according to this Example is capable of producing sharp clear toner images and is capable of repeated cycling without appreciable fatigue.

EXAMPLE XXXV

A series of 3 aluminum plates are coated with a solution of dibenzyl diselenide and poly(N-vinylcarbazole) in the manner described in Example I. Each coated aluminum plate is placed in a hood for several hours and then transferred to a vacuum chamber where it remains overnight. Sufficient solution is transferred to each of the aluminum plates to provide a coating having a dry film thickness of approximately 10 microns. Upon substantially complete removal of residual solvents from the coating, each of the coatings is uniformly illuminated with ultraviolet light from a distance of 6 inches of a period of 10 minutes. Each of these coated aluminum substrates is preheated on a warming table to a different temperature prior to enduring such irradiation in order to demonstrate the effects of thermal energy on the morphology of the selenium deposit. Where the temperature prevailing during photoextrusion of selenium is maintained at about 40° C (FIG. No. 2) the elemental selenium deposits appears as a dense continuous layer (approximately 0.07 microns in thickness) of very small (0.01 microns) selenium particles located approximately 0.04 microns below the outer surface of the coating. There is apparently some selenium deposited on both sides of this dense compact layer, however, due to the optical density of this layer ultraviolet light is precluded from penetrating substantially beyond this layer and thus little if any selenium is deposited throughout the bulk of the film. The same procedure is repeated with a second plate (FIG. No. 3) except the temperature prevailing immediately prior to and during such photoextrusion is approximately 60° C. At such higher temperatures, the layer of amorphous selenium appears to form discrete globules approximately 0.1 microns in diameter. The location of such globules is substantially the same as the dense compact layer described in plate 1.

A third plate (FIG. No. 4) is processed in the manner similar to that described for the plates referred to hereinabove (FIG. Nos. 2 and 3) except that immediately prior to and during exposure to ultraviolet light, its temperature is maintained at about 68° C. At such higher temperatures, amorphous selenium globules not only appear near the surface of the coating but are nonuniformly dispersed throughout the bulk of the organic polymer film. It is not known whether or not at such higher temperatures the selenium globules become mobile and migrate from immediately below the surface of the coating into the bulk of the film or whether or not the precursor compounds within the coating are less stable and thus more readily undergo selenium-carbon bond sision upon exposure to the ultraviolet light that is capable of penetrating the dense selenium deposit near the surface of the coating.

What is claimed is:

1. A process for preparation of a solid phase dispersion of inorganic photoconductive materials in an insulating matrix comprising a polymer capable of transport of charge carriers, said process comprising:
   a. forming a polymeric composition from a film forming insulating polymer capable of transport of charge carriers and an organo-selenium compound capable of selectively undergoing carbon-selenium bond scission when subjected to a source of electromagnetic, thermal or electron beam energy; and
   b. forming elemental selenium within the insulating polymer in conformity with the distribution of electromagnetic, thermal or electron beam energy therein by subjecting the organo-selenium compounds contained within said polymer to said energy.

2. The process of claim 1, wherein the relative weight ratio of organo selenium compound to film forming polymeric resin in the polymeric composition, prior to the deposition of elemental selenium, can range from about 10:90 to 90:10.

3. The process of claim 1, wherein the energy source is ultraviolet light.

4. The process of claim 1, wherein the energy source is visible light.

5. The process of claim 1, wherein the energy source is an electron beam.

6. The process of claim 1, wherein the energy uniformly blankets the exposed surface of the polymeric composition.

7. The process of claim 1, wherein the energy selectively impinges the surface of the polymeric composition.

8. The process of claim 1, wherein the energy is capable of substantial penetration below the surface of the polymeric composition.

9. The process of claim 1, wherein the energy is incapable of substantial penetration below the surface of the polymeric composition.

10. The process of claim 1, wherein the solid phase dispersion is heated subsequent to selenium deposition for the purpose of promoting selenium crystal growth, the duration of said heating and temperature to which the dispersion is exposed being insufficient to effect substantial depletion of elemental selenium from the dispersion.

11. The process of claim 1, wherein elemental selenium is deposited in response to thermal radiation.

12. The process of claim 1, wherein the relative weight ratio of organo-selenium compound to polymer in the polymeric composition, prior to extrusion and deposition of elemental selenium, can range from about 20:80 to about 30:70.

13. A process for preparation of a solid phase dispersion of inorganic photoconductive materials in a matrix comprising an insulating polymer capable of transport of charge carriers, said process comprising:
 a. forming a polymeric composition from a film forming insulating polymer capable of transport of charge carriers and at least one organo-selenium compound of the formula

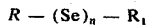

wherein
 R and $R_1$ are independently selected from the group consisting of benzyl, alkyl substituted benzyl, alkoxy substituted benzyl, acyl substituted benzyl, amino substituted benzyl, amido substituted benzyl, arylalkyl substituted benzyl, aryl substituted benzyl, alkoxy alkyl substituted benzyl, aryloxy alkyl substituted benzyl, amino alkyl substituted benzyl, hydroxy alkyl substituted benzyl, alkyl amino substituted benzyl, aryl amino substituted benzyl, alkyl carbonyl substituted benzyl, alkyl thio substituted benzyl, alkyl seleno substituted benzyl, carboxamido substituted benzyl, halogen substituted benzyl, carboxyl substituted benzyl, cyano substituted benzyl, and nitro substituted benzyl; alkyl, alkoxy, amino substituted alkyl, amido substituted alkyl, aryl alkyl, alkoxy alkyl, aryloxy alkyl, hydroxy substituted alkyl, carbonyl substituted alkyl, thio substituted alkyl, seleno substituted alkyl, carboxamido substituted alkyl, halogen substituted alky, carboxy substituted alkyl, cyano substituted alkyl, and nitro substituted alkyl; cyclo alkyl and substituted cyclo alkyl; heterocyclic radicals; and acyl radicals;
 $n$ is about 1 to about 4; and
 b. forming elemental selenium within the insulating polymer in conformity with the distribution of electromagnetic, thermal or electron beam energy therein by subjecting the organo-selenium compounds contained within said polymer to said energy.

14. The process of claim 13 wherein $R_1$ and $R_2$ are benzyl.

15. The process of claim 13 wherein at least one of $R_1$ or $R_2$ are alkyl.

16. The process of claim 13 wherein the polymeric matrix comprises poly(N-vinylcarbazole).

17. The process of claim 13 wherein the polymeric matrix comprises poly(vinylpyrene).

18. The process of claim 13 wherein the polymeric matrix comprises poly(N-ethyl-3-vinylcarbazole).

19. The process of claim 13 wherein elemental selenium is deposited in response to ultraviolet light.

20. The process of claim 13 wherein elemental selenium is deposited in response to a thermal radiation.

21. The process of claim 13 wherein the relative weight ratio of organo-selenium compound to polymer in the polymeric composition, prior to deposition of elemental selenium, can range from about 10:90 to about 90:10.

22. The process of claim 13 wherein the relative weight ratio of organo-selenium compound to polymer in the polymeric composition, prior to deposition of elemental selenium, can range from about 20:80 to about 30:70.

23. The process of claim 13 wherein the elemental selenium is deposited at random.

24. The process of claim 13 wherein the elemental selenium is deposited selectively.

25. A process for preparation of a solid phase dispersion of inorganic photoconductive materials in a matrix comprising an insulating hole transport polymer, said process comprising:
 a. forming a polymeric composition from a film forming insulating hole transport polymer and an organo-selenium compound capable of selectively undergoing carbon-selenium bond scission when subjected to a source of electromagnetic, thermal or electron beam energy; and
 b. forming elemental selenium within the insulating hole transport polymer in conformity with the distribution of electromagnetic, thermal or electron beam energy therein by subjecting the organo-selenium compounds contained within said matrix to said energy.

26. A process for preparation of a solid phase dispersion of inorganic photoconductive materials in a matrix comprising an insulating hole transport polymer, said process comprising:
 a. forming a polymeric composition from a film forming insulating hole transport polymer and at least one organo-selenium compound of the formula

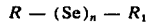

wherein
 R and $R_1$ are independently selected from the group consisting of benzyl, alkyl substituted benzyl, alkoxy substituted benzyl, acyl substituted benzyl, amino substituted benzyl, amido substituted benzyl, arylalkyl substituted benzyl, aryl substituted benzyl, alkoxy alkyl substituted benzyl, aryloxy alkyl substituted benzyl, amino alkyl substituted benzyl, hydroxy alkyl substituted benzyl, alkyl amino substituted benzyl, aryl amino substituted benzyl, alkyl carbonyl substituted benzyl, alkyl thio substituted benzyl, alkyl seleno substituted benzyl, carboxamido substituted benzyl, halogen substituted benzyl, carboxyl substituted benzyl, cyano substituted benzyl, and nitro substituted benzyl; alkyl, alkoxy, amino substituted alkyl, amido substituted alkyl, aryl alkyl, alkoxy alkyl, aryloxy alkyl, hydroxy substituted alkyl, carbonyl substituted alkyl, thio substituted alkyl, seleno substituted alkyl, carboxamido substituted alkyl, halogen substituted alky, carboxy substituted alkyl, cyano substituted alkyl, and nitro substituted alkyl; cyclo alkyl and substituted cyclo alkyl; heterocyclic radicals; and acyl radicals;
 $n$ is about 1 to about 4; and
 b. forming elemental selenium within the insulating polymer in conformity with the distribution of electromagnetic, thermal or electron beam energy therein by subjecting the organo-selenium compounds contained within said polymer to said energy.

27. A process for preparation of a solid phase dispersion of inorganic photoconductive materials in a matrix comprising an insulating electron transport polymer, said process comprising:
 a. forming a polymeric composition from a film forming insulating electron transport polymer and an organo-selenium compound capable of selectively undergoing carbon-selenium bond scission when subjected to a source of electromagnetic, thermal or electron beam energy; and
 b. forming elemental selenium within the insulating electron transport polymer in conformity with the distribution of electromagnetic, thermal or electron beam energy therein by subjecting the organo-selenium compounds contained within said polymer to said energy.

28. A process for preparation of a solid phase dispersion of inorganic photoconductive materials in a matrix comprising an insulating electron transport polymer, said process comprising:
 a. forming a polymeric compositions from a film-forming insulating electron transport polymer and at least one organo-selenium compound of the formula

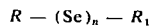

wherein $R$ and $R_1$ are independently selected from the group consisting of benzyl, alkyl substituted benzyl, alkoxy substituted benzyl, acyl substituted benzyl, amino substituted benzyl, amido substituted benzyl, arylalkyl substituted benzyl, aryl substituted benzyl, alkoxy alkyl substituted benzyl, aryloxy alkyl substituted benzyl, amino alkyl substituted benzyl, hydroxy alkyl substituted benzyl, alkyl amino substituted benzyl, aryl amino substituted benzyl, alkyl carbonyl substituted benzyl, alkyl thio substituted benzyl, alkyl seleno substituted benzyl, carboxamido substituted benzyl, halogen substituted benzyl, carboxyl substituted benzyl, cyano substituted benzyl, and nitro substituted benzyl; alkyl, alkoxy, amino substituted alkyl, amido substituted alkyl, aryl alkyl, alkoxy alkyl, aryloxy alkyl, hydroxy substituted alkyl, carbonyl substituted alkyl, thio substituted alkyl, seleno substituted alkyl, carboxamido substituted alkyl, halogen substituted alkyl, carboxy substituted alkyl, cyano substituted alkyl, and nitro substituted alkyl; cyclo alkyl and substituted cyclo alkyl; heterocyclic radicals; and acyl radicals;

$n$ is about 1 to about 4; and b. forming elemental selenium within the insulating electron transport polymer in conformity with the distribution of electromagnetic, thermal or electron beam energy therein by subjecting the organo-selenium compounds contained within said polymer to said energy.

* * * * *